United States Patent
Koushima et al.

[11] Patent Number: 5,885,505
[45] Date of Patent: Mar. 23, 1999

[54] METHOD FOR PRODUCING ELECTRONIC PART SEALED BODY

[75] Inventors: Yuji Koushima, Yokohama; Teiji Kohara, Kawasaki; Tadao Natsuume, Yokosuka, all of Japan

[73] Assignee: Nippon Zeon Co., Ltd., Tokyo, Japan

[21] Appl. No.: 916,781

[22] Filed: Aug. 25, 1997

Related U.S. Application Data

[63] Continuation of Ser. No. 126,202, Sep. 24, 1993, abandoned.

Foreign Application Priority Data

Sep. 30, 1992 [JP] Japan .................................. 4-285103

[51] Int. Cl.$^6$ .......................... B29C 70/70; B29C 35/02; B29C 41/20
[52] U.S. Cl. .............................. 264/272.13; 264/272.14; 264/272.15; 264/272.17
[58] Field of Search ..................... 264/272.13, 272.11, 264/272.15, 272.17, 275, 313, 297.8, 272.14

[56] References Cited

U.S. PATENT DOCUMENTS

| | | | |
|---|---|---|---|
| 4,055,613 | 10/1977 | Kapral | 264/46.4 |
| 4,189,517 | 2/1980 | Shanoski et al. | 264/259 |
| 4,483,811 | 11/1984 | Hirata | 264/328.12 |
| 4,635,356 | 1/1987 | Ohuchi et al. | 29/841 |
| 4,843,036 | 6/1989 | Schmidt et al. | 264/272.11 |
| 4,889,677 | 12/1989 | Hashimoto et al. | 264/297.5 |
| 4,954,308 | 9/1990 | Yabe et al. | 264/272.17 |
| 5,286,439 | 2/1994 | Shinohara | 264/272.17 |
| 5,366,812 | 11/1994 | Takahashi et al. | 264/345 |
| 5,409,996 | 4/1995 | Shinohara et al. | 525/189 |

*Primary Examiner*—Angela Ortiz
*Attorney, Agent, or Firm*—Armstrong, Westerman, Hattori, McLeland & Naughton

[57] ABSTRACT

A molding frame made by molding a thermoplastic norbornene resin which hardly deforms even after repeated use is used for production of electronic part sealed bodies by sealing the electronic devices of integrated circuits such as light emitting diodes, diodes, transistors, LSI devices, IC devices and CCD devices and capacitors, resistors, coils, microswitches and dipswitches with thermosetting resins such as epoxy resins as sealants.

15 Claims, 2 Drawing Sheets

METHOD FOR PRODUCING ELECTRONIC PART SEALED BODY

This application is a continuation of application Ser. No. 08/126,202 filed Sep. 24, 1993, now abandoned.

BACKGROUND OF THE INVENTION

1. Field of the Invention

The present invention relates to a molding frame for producing electronic part sealed bodies and a method for producing electronic part sealed bodies using the molding frame.

2. Related Art

Electronic parts such as electronic devices and microswitches are made of metals, ceramics or combination thereof and sometimes suffer damages in their functions owing to change of properties caused by air oxidation or water. Therefore, they are generally used in a sealed form cut off from air or water by sealants such as epoxy resins.

The electronic part sealed bodies are usually produced by placing an electronic part in a molding frame in such a manner that the electronic part does not contact with the surface of the molding frame, pouring a sealant into the molding frame and hardening the sealant.

The electronic part sealed bodies have various shapes and use of metallic molding frames causes increase of cost. Therefore, in general, those made of resins, mainly, polymethylpentene and polyphenyl sulfite are used. However, polymethylpentene is a crystalline resin and the molding frames made of this resin suffer from the problem that they are apt to deform due to relaxation of residual stress caused by the heat at the time of hardening the epoxy resin at a high temperature. Thus, it is difficult to produce electronic part sealed bodies high in molding accuracy and furthermore, the life of the molding frame per se has been considered to be at most 30 times in the number of sealings. Moreover, since polyphenyl sulfite is brittle, use of only this resin is insufficient and the resin must be reinforced with fillers such as glass fibers, glass beads and silica. However, if fillers are added, the surface of the molding frame is not smooth and the surface of the resulting electronic part sealed body is also not smooth. In addition, the molding frame made of polyphenyl sulfite is superior to the molding frame made of polymethylpentene in endurance, but the life of the former is still at most about 100 times in the number of sealings.

SUMMARY OF THE INVENTION

The inventors have conducted intensive research to develop a molding frame for producing electronic part sealed bodies which is transparent and can be used for a long period of time and as a result, have found that a molding frame of long life and of high surface accuracy can be obtained by making the frame using thermoplastic norbornene resins. Thus, the present invention has been accomplished.

The present invention provides a molding frame for producing electronic part sealed bodies which comprises a thermoplastic norbornene resin and a method for producing electronic part sealed bodies, characterized by placing an electronic part in said molding frame, pouring a thermosetting resin sealant into the frame and hardening the sealant.

Figure 1:
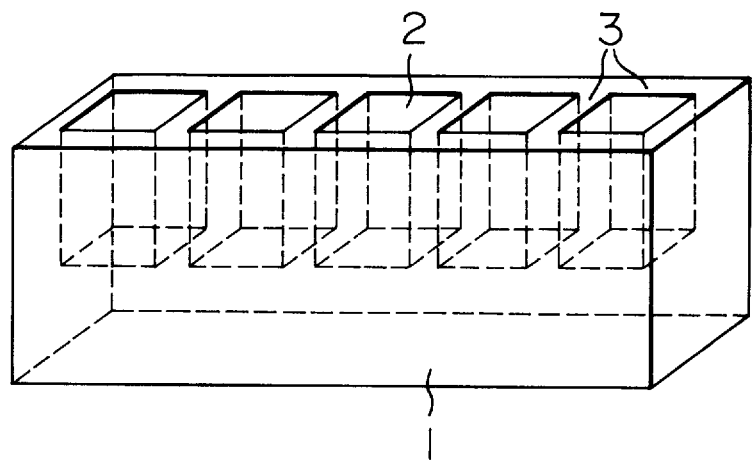
FIG. 1 is a perspective view showing one example of the shape of a molding frame of the present invention for producing electronic part sealed bodies.

In these FIG. 1–4, the reference numerals indicate the following:

1 Molding frame for producing electronic part sealed bodies
2 Portion in which sealant is filled
3 Partition wall
10 Lead frame
11 Light emitting diode fixing portion
12 Gold wire fixing portion
13 Hole for fixation
14 Connecting portion for fixation
15 Lead wire
16 Connecting portion
20 Jig
21 Base
22 Depressed portion
23 Projection
24 Column
25 Belt-like fixer

DETAILED DESCRIPTION OF PREFERRED EMBODIMENTS

The molding frame for production of electronic part sealed bodies of the present invention hardly deforms at the time of hardening of a thermosetting sealant and can be used many times as compared with conventional molding frames.

The molding frame for production of electronic part sealed bodies according to the present invention will be explained in detail below.

Thermoplastic Norbornene Resins

The thermoplastic norbornene resins used in the present invention are known ones disclosed, for example, in Japanese Patent Application Kokai Nos. 3-14882, 3-122137 and 4-63807 and as examples thereof, mention may be made of ring-opening polymers of norbornene monomers, hydrogenated products of these polymers, addition polymers of norbornene monomers and addition polymers of norbornene monomers with olefins.

The norbornene monomers are also known ones disclosed in the above patent publications and besides, in Japanese Patent Application Kokai Nos. 2-227424 and 2-276842. Examples of the norbornene monomers are norbornene, alkyl, alkylidene or aromatic group-substituted derivatives thereof and these substituted or unsubstituted norbornenes which are substituted with polar groups such as halogen, hydroxyl group, ester group, alkoxy group, cyano group, amide group, imide group and silyl group, for example, 2-norbornene, 5-methyl-2-norbornene, 5,5-dimethyl-2-norbornene, 5-ethyl-2-norbornene, 5-butyl-2-norbornene, 5-ethylidene-2-norbornene, 5-methoxycarbonyl-2-norbornene, 5-cyano-2-norbornene, 5-methyl-5-methoxycarbonyl-2-norbornene, 5-phenyl-2-norbornene, 5-phenyl-5-methyl-2-norbornene, 5-hexyl-2-norbornene, 5-octyl-2-norbornene and 5-octadecyl-2-norbornene; macromers of cyclopentadiene and their derivatives and substitution products similar to those mentioned above, such as monomers comprising norbornene to which one or more cyclopentadienes are added and their derivatives and substitution products similar to those mentioned above, for example, 1,4:5,8-dimethano-1,2,3,4,4a,5,8,8a-2,3-cyclopentadienonaphthalene, 6-methyl-1,4:5,8-dimethano-1,4,4a,5,6,7,8,8a-octahydronaphthalene and 1,4:5,10:6,9-trimethano-1,2,3,4,4a,5,5a,6,9,9a,10,10a-dodecahydro-2,3-cyclopentadienoanthracene; polycyclic monomers which are macromers of cyclopentadiene and their derivatives and substitution products similar to those mentioned above, for example, dicyclopentadiene and 2,3-dihydrodicyclopentadiene; adducts of cyclopentadiene with tetrahydroindene or the like and their derivatives and substitution products similar to those mentioned above, for example, 1,4-methano-1,4,4a,4b,5,8,8a,9a-octahydrofluorene and 5,8-methano-1,2,3,4,4a,5,8,8a-octahydro-2,3-cyclopentadienonaphthalene.

When the norbornene monomers are polymerized in the present invention, they may be copolymerized with other copolymerizable cycloolefins as far as the effects of the present invention are not substantially damaged. Examples of the copolymerizable cycloolefins used in ring opening polymerization are compounds having at least one reactive double bond such as cyclopentene, cyclooctene and 5,6-dihydrodicyclopentadiene.

Polymerization of the norbornene monomers can be carried out by known processes and when the monomers have a double bond, if necessary, they may be hydrogenated by known processes to prepare thermoplastic saturated norbornene resins.

The thermoplastic norbornene resins used in the present invention have a glass transition temperature (hereinafter referred to as "Tg") of preferably 100° C. or higher, more preferably 120° C. or higher and especially preferably 130° C. or higher. In the case of the sealant mentioned hereinafter being a thermosetting resin, Tg of the thermoplastic norbornene resin which forms the molding frame is higher than the hardening temperature of the sealant, preferably higher than (hardening temperature of sealant+5° C.), more preferably higher than (hardening temperature of sealant+10° C.). Number-average molecular weight of the thermoplastic norbornene resin is 10,000–200,000, preferably 20,000–100,000, more preferably 25,000–50,000 which is measured by GPC (gel permeation chromatography) process using a toluene solvent and which is in terms of polystyrene. If the number-average molecular weight is too small, mechanical strength is inferior and if it is too large, moldability deteriorates.

Furthermore, in order that releasing after electronic parts are sealed can be easily carried out and molding can be accurately performed, the thermoplastic norbornene resins are preferably those which are low in adhesion to sealants, namely, have less polar substituents, especially preferably, those which have no polar group. The thermoplastic norbornene resins having no polar group can be obtained by polymerizing only the monomers having no polar group.

In the case of the thermoplastic norbornene resins being hydrogenated, the hydrogenation rate is 90% or higher, preferably 95% or higher, more preferably 99% or higher from the points of heat deterioration resistance and light deterioration resistance.

The thermoplastic norbornene resins may further contain aging inhibitors, light stabilizers, ultraviolet absorbers, flexibilizers, plasticizers, tackifiers, colorants, lubricants, inorganic fillers such as glass fibers, glass beads, carbon black, white carbon, calcium carbonate, talc and clay, rubber-like polymers, other thermoplastic norbornene resins and other additives.

Molding Method

The molding frame used for producing electronic part sealed bodies of the present invention is made by molding the thermoplastic norbornene resin. The molding method is not limited and it is generally made by injection molding. Molding conditions for injection molding also have no special limitations and usual molding conditions for molding thermoplastic norbornene resins can be employed.

Molding Frame for Producing Electronic Part Sealed Bodies

The molding frame for producing electronic part sealed bodies of the present invention is a frame used for molding the sealed portion of the electronic part sealed bodies and usually provided with a plurality of portions in which sealant is poured so that a plurality of sealings can be attained by one molding frame.

The shape of the molding frame is unlimited. FIG. 1 shows one example of the molding frame. In this molding frame 1, five sealant filling portions 2 are arranged in a line, but they may be arranged in a plurality of lines. The number of the sealant filling portions per one line is also unlimited. The sealant filling portions may not be arranged in a line or lines.

The shape and size of the sealed portion are determined depending on the shape and size of the electronic parts so that electronic parts and metal frame combined therewith can be sealed and furthermore, are determined depending on the shape and size of the sealant filling portions. In the molding frame 1, they are in the form of rectangular parallelopiped and the shape and size have no special limitations as far as electronic parts can be sealed.

For removing a sealed body in which voids are generated at the time of hardening reaction of the sealant before completion of sealing and thus enhancing efficiency of steps, the molding frame preferably has transparency.

In order that the molding frame can have such a transparency that the state of reaction in the molding frame can be seen, the molding frame should have a light transmittance of preferably 40% or higher, more preferably 60% or higher, especially preferably 80% or higher.

The sealant filling portions may be connected to each other by a groove or a hole so that when the sealant is poured into one sealant filling portion, the sealant can extend to other sealant filling portions. However, when molding accuracy of the electronic part sealed body is demanded, a step of removing the projected portions formed by the groove or hole after hardening is needed and it is preferred not to provide such groove or hole. In this case, the sealant must be independently poured into the respective sealant filling portions.

Releasing Agent

In general, the thermoplastic norbornene resins adhere to the sealants, especially, to thermo-setting resins with difficulty and usually the sealed bodies can be easily released. Therefore, it is preferred not to use releasing agents from the points of reduction in operating labor for coating a releasing agent and prevention of incorporation of impurities into the sealed bodies. However, for attaining more easy releasing, a releasing agent may be previously coated on the inner wall of the sealant filling portion of the molding frame or a releasing agent may be contained in the sealant. When the releasing agent is used, it is especially preferred to coat a solution of silicone in an organic solvent on the inner wall of the molding frame and remove the solvent to form a layer of the releasing agent.

As silicones used in the present invention, preferred are those which can be diluted with a solvent which does not substantially dissolve or swell the thermoplastic norbornene resins and the solutions of which are good in wettability with the surface of the thermoplastic norbornene resin, are not repelled at the surface and can provide a silicone layer free from unevenness of coating. As such silicones, benzene ring containing silicones are preferred and alkylphenylsilicones and aralkyl-modified dialkylsilicones are especially preferred. The alkylphenylsilicones are preferably those which are obtained by replacing a part of methyl groups, preferably 1–60%, more preferably 3–40%, especially preferably 5–20% of methyl groups of dimethylsilicone with phenyl groups and the remaining methyl groups may be replaced with other alkyl groups. The aralkyl-modified dialkylsilicones are preferably those which are obtained by replacing a part of methyl groups, preferably 1–60%, more preferably 3–40%, especially preferably 5–20% of methyl groups of dimethylsilicone with aralkyl groups and the remaining methyl groups may be replaced with other alkyl groups.

Furthermore, the silicones have a viscosity of preferably 10–100,000 $mm^2$/sec, more preferably 50–10,000 $mm^2$/sec, especially preferably 100–5,000 $mm^2$/sec at 25° C. If the viscosity is too high, flowability is inferior and unevenness of coating is apt to occur and if it is too low, the silicone layer is apt to peel off and flow away from the inner wall of the frame when the thermosetting resin is poured.

Typical examples of the silicones are methylphenylsilicones such as KF50, KF54 and KF56 (manufactured by Shin-Etsu Chemical Co., Ltd.) and alkylaralkyl-modified dimethylsilicones such as KF410 (manufactured by Shin-Etsu Chemical Co., Ltd.) and TSF4420 (manufactured by Toshiba Chemical Co., Ltd.).

As the solvents used for preparing silicone solutions in the present invention, there may be used those which do not substantially dissolve or swell the thermoplastic norbornene resins, namely, poor solvents for the thermoplastic norbornene resins. Moreover, mixed solvents of a poor solvent and a good solvent for the thermoplastic norbornene resins can be used as solvents for the silicone solutions as far as they do not dissolve or swell the thermoplastic norbornene resins. As examples of the solvents, mention may be made of alcohols such as isopropyl alcohol, isobutyl alcohol and n-amyl alcohol; ethers such as ethyl cellosolve, 1-acetoxy-2-ethoxyethane and 1-methoxy-2-acetoxypropane; ketones such as acetone, diisobutyl ketone, methyl ethyl ketone and methyl isobutyl ketone; and esters such as ethyl acetate, isopropyl acetate, butyl acetate, isobutyl acetate, amyl cetate and ethyl propionate. Among them, acetate esters are preferred in view of high dispersibility for silicones and excellent surface smoothness of the silicone film after coated. Especially preferred are ethyl acetate, isobutyl acetate and butyl acetate and among them preferred are those which rapidly volatilize after coating and are excellent in workability and have a boiling point of lower than 130° C.

Concentration of the silicone solution is preferably 0.05–60% by weight, especially preferably 0.5–30% by weight, more preferably 2–15% by weight. If the concentration is too low, silicone films of sufficient thickness are obtained with difficulty and if it is too high, unevenness of coating is apt to occur and dimensional accuracy of the sealed body becomes inferior.

Method for coating the diluted solution of silicone on the inner wall of the molding frame of the present invention is unlimited and any methods of dipping, spraying, brushing and the like can be used, but the spraying method is generally used because unevenness of coating hardly occurs. Coating amount is determined so that the thickness of silicone film formed after removal of the solvent is 0.1–100 μm, preferably 0.5–30 μm, more preferably 1–10 μm.

After the diluted solution of silicone is coated, the solvent is removed. Since the solvent used in the present invention readily volatilizes, it can be easily removed by merely leaving the coat at room temperature, but for sufficient removal of the solvent, it is preferred to keep the coat at 90°–110° C. for about 10–60 minutes. However, the temperature should not exceed Tg of the thermoplastic norbornene resin, preferably should not exceed Tg–5° C., more preferably should not exceed Tg–10° C. If the temperature is too low or the coat is kept at a high temperature for a short time, the removal of the solvent is insufficient and when the thermosetting sealant is heated for hardening, foaming sometimes occurs and surface smoothness of the sealed body is lost. If the temperature is too high, the molding frame deforms or if it is kept at a high temperature for a long time, operating efficiency decreases.

In general, the film of releasing agent peels off from the frame at every sealing. Therefore, it is preferred to form the film of releasing agent at every sealing.

Electronic Parts

The electronic parts used in the present invention include, for example, electronic devices of integrated circuits such as light emitting diodes, diodes, transistors, LSI devices, IC devices and CCD devices, capacitors, resistors, coils, microswitches and dip switches.

Lead Frame

Many of these electronic parts, especially electronic devices are fixed to metallic lead frame and electric current is flowed or voltage is applied to the electronic parts through the lead frame.

Size and shape of the lead frame are determined depending on size, shape, function and object of the electronic parts fixed thereto. The fixing method is unlimited as far as the electronic parts are not deteriorated and the lead frame and the electronic parts are not insulated. For example, the electronic parts can be fixed by bonding with die bonding pastes such as epoxy silver paste.

Figure 2:
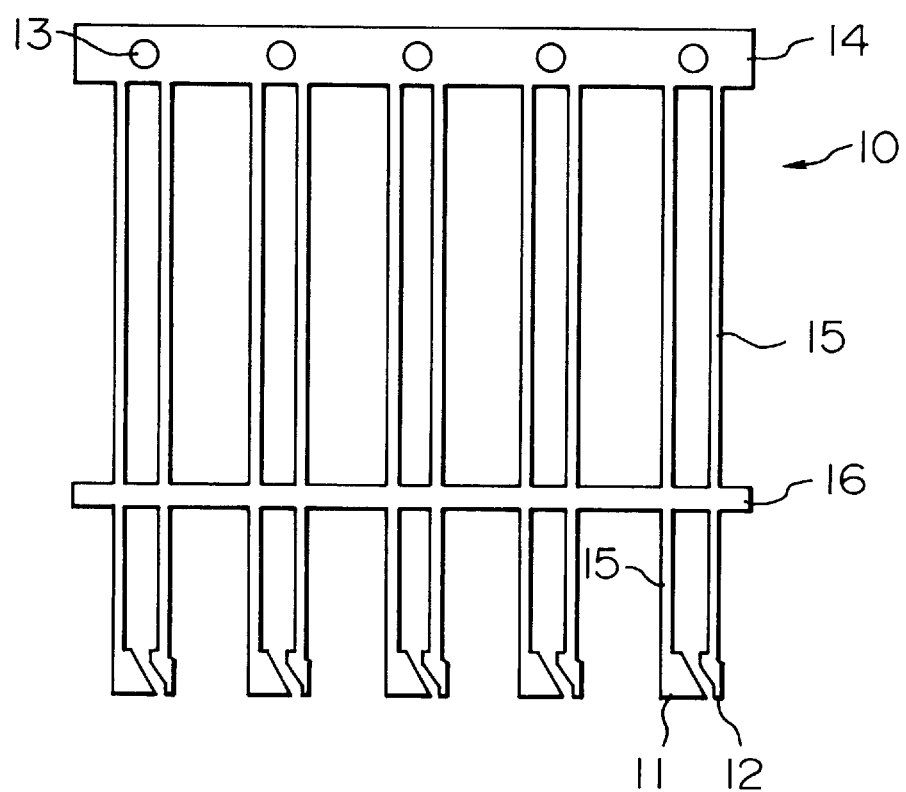
FIG. 2 is a front view showing one example of the shape of a lead frame used in the present invention.

FIG. 2 shows one example of lead frame 10 for light emitting diodes. Five light emitting diodes can be fixed to this metal frame and after being sealed, the metal frame is cut to obtain five sealed light emitting diodes.

A light emitting diode is fixed to the light emitting diode fixing part 11 of the lead frame 10 and the light emitting diode and gold wire fixing part 12 are wire bonded with a gold wire.

Sealant

The sealants used in the present invention have no special limitations as far as the molding frame of the present invention can be used. As examples of the sealants, mention may be made of phenolic thermosetting sealants, xylene thermosetting sealants, diallyl phthalate thermosetting sealants, unsaturated polyester thermosetting sealants, epoxy thermosetting sealants, acrylic thermosetting sealants, furan thermosetting sealants, aniline thermosetting sealants, polyurethane thermosetting sealants, polybutadiene thermosetting sealants, melamine phenolic thermosetting sealants and silicone thermosetting sealants. Among them, epoxy thermosetting sealants are preferred from the points of electrical properties, mechanical strength, heat resistance, flowability at molding step and sealability of electronic parts.

The epoxy thermosetting compositions used in the present invention are known ones, for example, as described in Japanese Patent Application Kokai No. 61-1884115. Basically, they comprise a thermosetting epoxy compound and a hardener and, if necessary and depending on objects, they may further contain hardening accelerators, fillers, flame retardants, flame retarding aids, colorants, surface coupling agents and the like.

The thermosetting epoxy compounds are not limited and known epoxy compounds may be used. As the hardeners, there may be used isocyanates, dimers and trimers thereof, maleimides, and the like as well as known hardeners for epoxy resins such as phenols, amines, polyamides, imidazoles, and acid anhydrides. The hardening accelerators may also be known ones. For example, when phenolic hardeners are used, nitrogen-containing heterocyclic compounds may be used. The fillers are also not limited and preferred are inorganic fillers such as calcium carbonate, silica, zirconium silicate, calcium silicate, talc, clay, mica, glass fibers and glass beads.

Sealing

An electronic part is placed in the internal space of the sealant filling portion of the molding frame so that the electronic part does not contact with the inner wall of the space and then the sealant is poured into the space and hardened to perform sealing.

The method of placing the electronic part in the space of the sealant filling portion is not limited. When a light transmitting diode is fixed to lead frame 10 and sealed using molding frame 1, for example, as shown in FIG. 4, the lead frame 10 may be arranged in the internal spaces of the sealant filling portions of the molding frame 1 using the jig 20 shown in FIG. 3.

Figure 4:
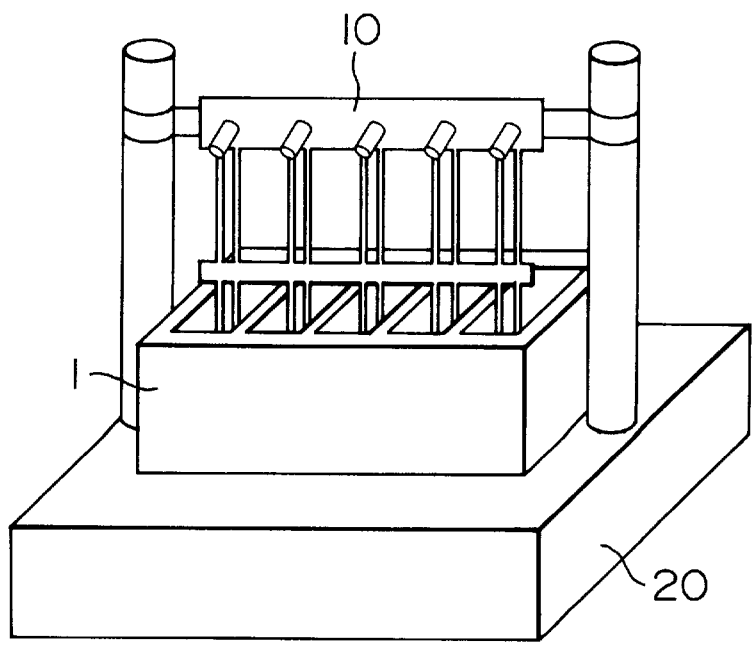
FIG. 4 is a perspective view showing one example of the method of using the jig in the present invention.

There is a depressed portion 22 at the center of base 21 of the jig 20 and the molding frame 1 is inserted in the depressed portion 22 and can be fixed as shown in FIG. 4. The projected portions 23 of jig 20 are passed through the holes 13 of lead frame 10, whereby the electronic parts fixed to the lead frame 10 can be arranged in the spaces of the sealant filling portions of molding frame 1 in such a manner that the electronic parts do not contact the inner wall of the spaces.

The method of pouring the sealant into the molding frame is not limited. The amount of the sealant poured into the molding frame is also unlimited as far as the electronic part can be sealed. The layer of the sealant is preferably thin as far as the sealing can be performed from the points of reduction of the amount of the sealant used, shortening of hardening time and increase in density of electronic parts on circuit boards or the like. However, for complete cutting off of air or water which is the object of the sealing, it is preferred to increase the thickness of the sealant layer.

In general, after hardening, the molding frame is removed and then the lead frame is cut at the portions under the connecting portions 16 to cut the sealed bodies apart from the lead frame. When a releasing agent is used, a layer of the releasing agent sometimes deposits on the surface of the sealed bodies, but this is not problem and generally the sealed bodies are used without removing the deposited layer.

Electronic Part Sealed Body

The electronic part sealed body obtained by the present invention is an electronic part sealed by the sealant and the shape of the sealed portion is determined depending on the shape and size of the electronic part. Usually, electric current can be passed to the electronic part through a lead wire the one end of which is connected to the electronic part and the another end of which is out of the sealed portion. Other portions are insulated.

In this electronic part sealed body, since the electronic part is sealed therein, the electronic part does not contact oxygen in the air or water.

The present invention is explained in more detail by the following examples and comparative examples.

EXAMPLE 1

A thermoplastic saturated norbornene resin (ZEONEX 280 having a Tg of 140° C. and a number-average molecular weight of about 28,000 manufactured by Nippon Zeon Co., Ltd.) was preheated at 90° C. for 3 hours and was injection molded under the conditions of cylinder temperature: 300° C., mold temperature: 100° C. and injection pressure: 500 kgf/cm$^2$ using an injection molding machine (vertical injection molding machine SAV-30/30 with fixed top force and movable bottom force manufactured by Yamashiro Seiki Seisakusho Co.) to make a molding frame for production of electronic part sealed body which had a shape as shown in FIG. 1.

The molding frame 1 of FIG. 1 had a width of 8.0 mm, a length of 41.6 mm and a height of 20.0 mm. The sealant filling portion 2 had a width of 4.0 mm, a length of 5.92 mm and a depth of 10.0 mm. The thickness of the partition wall 3 between the sealant filling portions or between the sealant filling portion and the outer surface of the molding frame was 2.0 mm.

EXAMPLE 2

A metal lead frame (EME 2003-2 manufactured by Enomoto Co. which was cut for five light emitting diodes and had the shape as shown in FIG. 2), five light emitting diodes constructed of semiconductor PN junction and gold wire (rated current 20 mA) were arranged in the molding frame obtained in Example 1.

In FIG. 2, the connecting portion 14 of the lead frame 10 had a width of 3.11 mm and the fixing holes 13 had a circular shape of 1.58 mm in diameter and were provided at a distance between centers of 7.92 mm. Furthermore, lead wires 15 having a width of 0.5 mm perpendicularly and downwardly extended from the positions at a distance of 1.27 mm from the center of the hole 13 on left and right sides of the hole with the center of the width of each lead wire passing through said position. The lead wires 15 were connected by the connecting portions 16 of 1.26 mm at a distance of 21.53 mm from the connecting portions 14. The lead wires further extended downwardly from the connecting portions 16 and the distance from the connecting portion 16 to the end light emitting diode fixing portion 11 was 10.17 mm and the distance from the connecting portion 16 to the end gold wire fixing portion 12 was 10.32 mm. A disc of 1.3 mm in diameter was fitted horizontally to the light emitting diode fixing portion 11. Thickness of the lead frame excluding this disc portion was 0.5 mm.

Figure 3:
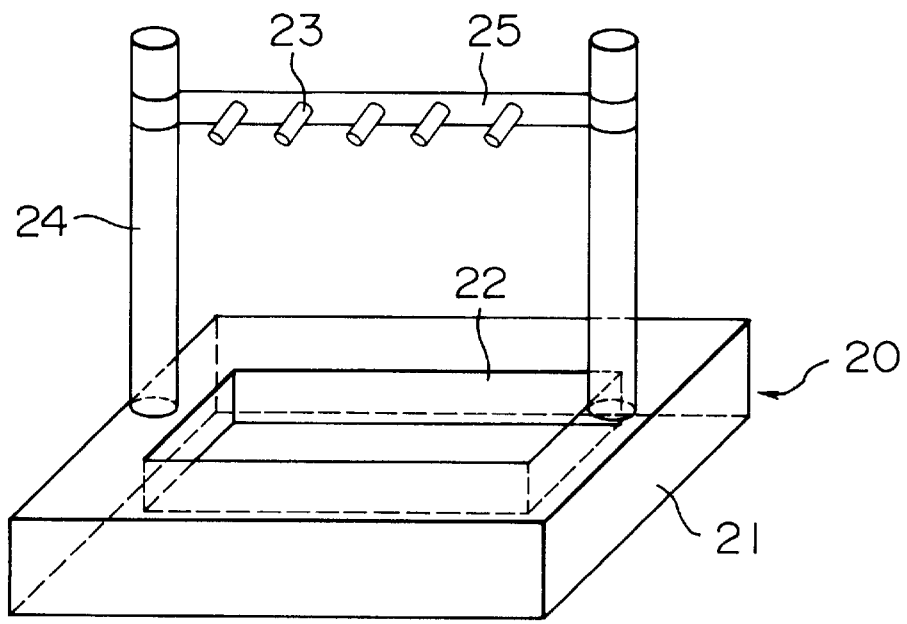
FIG. 3 is a perspective view showing one example of the shape of a jig used in the present invention.

As shown in FIG. 4, this lead frame 10 to which the light emitting diode chips were fixed was fixed to the fixing jig 20 shown in FIG. 3 and the jig was held horizontally.

The base 21 of the fixing jig 20 shown in FIG. 3 had a width of 16.1 mm, a length of 61.9 mm and a height of 10.0 mm and a depressed portion 22 of 8.1 mm in width, 41.9 mm in length and 8.0 mm in depth was provided at the center of the base. Columns 24 were stood perpendicularly on the left and right sides of the depressed portion 22 of the base 21 and a belt-like fixer 25 was fixed between the two columns 24. Projections 23 were provided at the belt-like fixer 25 so as to positionally correspond to the five holes 13 of the lead frame 10. As shown in FIG. 4, when the molding frame 1 was fixed in the depressed portion 22 and furthermore, the projections 23 were passed through the holes 13 of the lead frame shown in FIG. 2 and the lead frame was fixed, the center of light emitting diode was positioned at the center of the sealant filling portion 2.

A sealant prepared by adding 90 parts by weight of 4-methylhexahydrophthalic anhydride and 1 part by weight of 2-ethyl-4-methylimidazole to 100 parts by weight of a bisphenol A type epoxy composition (EP-826 manufactured by Yuka Shell Epoxy Co.) was poured into the sealant filling portions 2 up to the edge and hardened by keeping at 110° C. for 20 hours and the linked lead frame 10 was cut at the positions just below the connecting portions 16 to obtain five sealed light emitting diodes from one molding frame.

Using this molding frame, the sealed light emitting diodes were repeatedly obtained in the same manner as above. The width at the center of the sealed light emitting diodes obtained from the central sealant filling portion 2 was measured to obtain 3.96 mm, 3.98 mm, 4.01 mm, 4.04 mm and 4.06 mm at the 1st, 30th, 50th, 100th and 150th sealings, respectively.

The two hundred sealed light emitting diodes obtained by 1st-40th sealings were visually examined to find that two of them had surface roughness.

EXAMPLE 3

Five parts by weight of an aralkyl-modified alkyl silicone KF410 (having a viscosity of 1400 mm$^2$/sec manufactured by Sin-Etsu Chemical Co., Ltd.) was dissolved in 95 parts by weight of ethyl acetate (special grade chemical manufactured by Wako Junyaku Kogyo Co.) to prepare a silicone solution. The inner wall of the sealant filling portions of the molding frame obtained in Example 1 was sprayed with the resulting silicone solution in an amount of 15 mg per one sealant filling portion, followed by drying at 100° C. for 30 minutes to form a silicone layer. According to visual examination, the thickness of the silicone layer was substantially uniform and unevenness of coating was not found.

In the same manner as in Example 2, sealed light emitting diodes were repeatedly produced with forming the silicone layer at every sealing and the width at the center of the sealed light emitting diodes obtained from the central sealant filling portion 2 was measured to obtain 3.95 mm, 3.97 mm, 3.99 mm, 4.00 mm and 4.02 mm at the 1st, 30th, 50th, 100th and 150th sealings, respectively.

The two hundred sealed light emitting diodes obtained by 1st-40th sealings were visually examined to find that none of them had surface roughness.

Comparative Example 1

A molding frame for production of electronic part sealed bodies which had the shape as shown in FIG. 1 was produced in the same manner as in Example 1 except that polymethylpentene (TPX MX004 manufactured by Mitsui Petrochemical Industries, Ltd.) was used in place of the thermoplastic saturated norbornene resin and the injection molding conditions were cylinder temperature: 300° C., mold temperature: 80° C. and injection pressure: 250 kgf/cm$^2$.

Using this molding frame, sealed light transmitting diodes were repeatedly produced in the same manner as in Example 2. The width at the center of the sealed light emitting diodes obtained from the central sealant filling portion 2 was measured to obtain 3.95 mm, 4.12 mm, 4.29 mm and 4.45 mm at the 1st, 30th, 50th and 100th sealings, respectively.

The two hundred sealed light emitting diodes obtained by 1st-40th sealings were visually examined to find that surface roughness was seen on fifty-three diodes.

Comparative Example 2

A molding frame for production of electronic part sealed bodies which had the shape as shown in FIG. 1 was produced in the same manner as in Example 1 except that polyphenylene sulfide (Fortron 1140A1 manufactured by Polyplastic Co.) was used in place of the thermoplastic saturated norbornene resin and the preheating conditions were 140° C. and 3 hours and the injection molding conditions were cylinder temperature: 310° C., mold temperature: 150° C. and injection pressure: 500 kgf/cm$^2$.

Using this molding frame, the sealed light emitting diodes were repeatedly produced in the same manner as in Example 2. The width at the center of the sealed light emitting diodes obtained from the central sealant filling portion 2 was measured to obtain 3.98 mm, 4.06 mm, 4.11 mm, 4.25 mm and 4.39 mm at the 1st, 30th, 50th, 100th and 150th sealings, respectively.

Comparative Example 3

The procedure of Example 3 was repeated except that 5 parts by weight of dimethylsilicone KF96 (having a viscosity of 1000 mm$^2$/sec at 25° C. manufactured by Sin-Etsu Chemical Co., Ltd.) was used in place of the aralkyl-modified alkylsilicone. The silicone solution was repelled by the surface of the thermoplastic norbornene resin, resulting in unevenness of coating of the silicone layer.

What is claimed is:

1. A method for producing an electronic part sealed body comprising steps of:
   providing unitary modeling frame body of a material which consist essentially of a thermal plastic norbornene resin, said mdodedling frame body including at least one an internal space defining a sealant filling portion, each of said internal having an opening formed by at least one side surface and a bottom surface opposite from the opening, said side surface and said bottom surface being continuous;
   locating an electronic part within the internal space of the modeling frame body;
   pouring a thermosetting sealant in the internal space of the modeling frame body;
   hardening the sealant; and
   removing the electronic part and hardened sealant from the internal space of the modeling frame body.

2. A method according to claim 1, wherein the molding frame body has a light transmittance of 40% or higher.

3. A method according to claim 1, wherein the thermosetting sealant includes an epoxy thermosetting composition.

4. A method according to claim 3, further including applying a layer of silicone on a surface of the internal space of the molding frame body, the silicone of the layer including benzene ring containing silicone.

5. A method according to claim 4, wherein a silicone solution is coated on a surface of the internal space and solvent is removed to form the silicone layer.

6. A method according to claim 1, wherein the norbornene resin has a glass transition temperature of 100° C. or higher.

7. A method according to claim 6, wherein the norbornene resin has a number average molecular weight in terms of polystyrene of 10,000–200,000 measured by gel permeation chromatography using toluene as a solvent.

8. A method according to claim 6, wherein the norbornene resin is one having no polar substituent.

9. A method according to claim 1, wherein said molding frame body has transparency.

10. A method according to claim 1,
wherein said molding frame body is produced from the norbornene resin by injection molding.

11. A method according to claim 1, wherein the norbornene resin has a number-average molecular weight in terms of polystyrene of 10,000–200,000 measured by gel permeation chromatography using toluene as a solvent.

12. A method according to claim 1, wherein the norbornene resin is one having no polar substituent.

13. A method for producing an electronic part sealed body comprising steps of:

providing a molding frame body of a material which consists essentially of a thermoplastic norbornene resin, said molding frame body having at least one internal space defining a sealant filling portion, each of said internal spaces having an opening formed by at least one side surface and a bottom surface opposite from the opening;

suspending an electronic part on a jig;

locating said electronic part within the internal space of the molding frame body, wherein the electronic part is not in contact with a surface of the internal space;

pouring a thermosetting sealant in the internal space of the molding frame body;

hardening the sealant; and removing the electronic part and hardened sealant from the internal space of the molding frame body.

14. A method according to claim 13, wherein the electronic part is fixed to a lead frame.

15. A method according to claim 1, wherein the step of locating comprises suspending the electronic part fixed to the lead frame on a jig, and putting the electronic part within the internal space of the molding frame body.

* * * * *